March 30, 1971 YASUO NANNICHI 3,573,113

METHOD OF PREPARING A P-N JUNCTION

Filed Nov. 7, 1967

INVENTOR.
YASUO NANNICHI

BY

Hopgood & Calimafde
ATTORNEYS

United States Patent Office 3,573,113

Patented Mar. 30, 1971

3,573,113

METHOD OF PREPARING A P-N JUNCTION

Yasuo Nannichi, Tokyo, Japan, assignor to Nippon Electric Company Limited, Tokyo, Japan Filed Nov. 7, 1967, Ser. No. 681,152
Claims priority, application Japan, Nov. 19, 1966, 41/76,069
Int. Cl. H01l 7/36
U.S. Cl. 148—191 5 Claims

ABSTRACT OF THE DISCLOSURE

A method is provided for preparing p-n junctions in semiconductor wafers wherein an impurity in the wafer is caused by thermal treatment to diffuse outward so that the impurity concentration at or near the surface of the wafer is decreased relative to the higher bulk impurity concentration. A p-n junction is formed in the semiconductor wafer in such a manner that the bottom part of said p-n junction may reach a region of said semiconductor wafer where the outdiffusion in regard to the impurity concentration is no more effected.

DETAILED DESCRIPTION OF THE INVENTION

This invention relates generally to methods and techniques of preparing p-n junctions in semiconductors in such a manner that the effect of surface breakdown can be substantially eliminated and maximum reverse voltages at or near the semiconductor surface may be raised, and more particularly to a new and improved method of making p-n junctions in semiconductors in the manner described by use of outdiffusion.

Among breakdown voltage VB for a p-n junction, donor impurity density ND, and acceptor impurity density NA, there should be a relationship that the smaller the value of both ND and NA the larger the value of VB as is illustrated, for instance, in a publication entitled "Physics of Semiconductors" by John L. Mall, published by McGraw-Hill Book Co., 1964, pp. 234–235.

Referring to the drawing.

Figure 1:
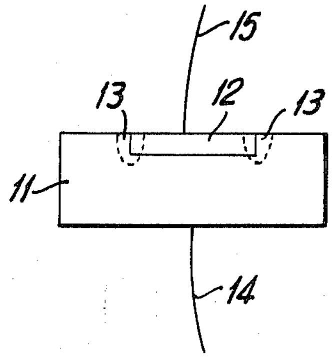
FIG. 1 is a schematic cross-sectional view of a conventional guard ring diode structure.

It is known that maximum reverse voltages for p-n junctions tend to exhibit values lower than are predicted by theory because of the presence of the intersection of the junction with the semiconductor surface. The guard ring structure as illustrated schematically in FIG. 1 has been known as an effective countermeasure for eliminating as much as possible the effect of surface breakdown as disclosed, for example, in "Journal of Applied Physics," vol. 34, No. 6, (June 1963), pp. 1591–1600. Such a guard ring diode structure can be fabricated, as will be seen in the illustration of FIG. 1, by forming p-type (or n-type) guard ring 13 with a comparatively low impurity concentration in the surface of an n-type (or p-type) semiconductor substrate 11 through the selective diffusion method and then, doping p-type (or n-type) region 12 with a comparatively high impurity concentration therein, and finally bonding leads 14 and 15 at opposing surfaces of the semiconductor. This method has has been found not only laborious in that many processes such as masking, diffusion, etc. are inevitably involved but also unreliable in that the yield is appreciably low.

The present invention is intended to provide a simple and yet, reliable method of making p-n junctions in semiconductors as compared with the conventional methods.

An outstanding feature of this invention resides in making the p-n junction in a semiconductor wafer which has been subjected to outdiffusion, in such a manner that the bottom part of the p-n junction may reach a depth at which the effect of outdiffusion in regard to impurity concentration can no more be admitted. The outdiffusion is performed either by heating the semiconductor wafer containing impurities at an elevated temperature in a high vacuum to diffuse the impurities into the vacuum or by thermally forming an oxide layer on the wafer surface so that impurities may diffuse into the oxide layer. Such outdiffusion processes and techniques will not be mentioned here in more detail for simplicity, because they are fully disclosed, for example, in "Proceedings of the IRE," volume 46 (1958), pp. 1068–1076 and in "Journal of Applied Physics," volume 35 (1964), pp. 2695–2709.

Figure 2:
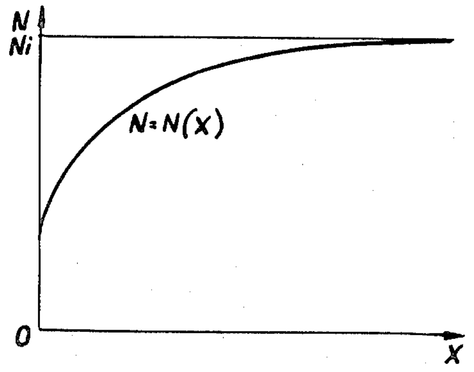
FIG. 2 is a diagram illustrating impurity distribution in a typical out-diffused semiconductor after the starting semiconductor doped uniformly with an impurity has been subjected to the out-diffusion process.

FIG. 2 is a typical diagram illustrating the impurity distribution for an outdiffused semiconductor wafer which had a uniform impurity concentration before outdiffusion, wherein the abscissa X and the ordinate N represent respectively depth from the wafer surface or from the oxide-semiconductor interface in the presence of an oxide layer and impurity concentration. A tendency that the concentration decreases exponentially with decreasing depth to reach a minimum at the wafer surface or at the interface will be obvious by inspection of the curve $N=N(x)$ in FIG. 2.

Figure 3:
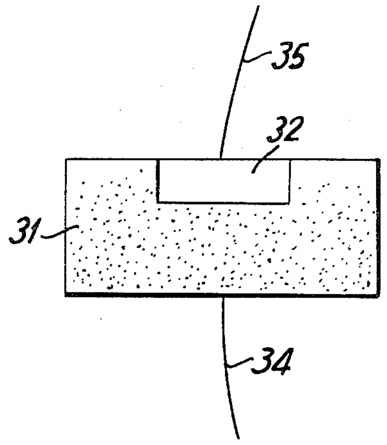
FIGS. 3 and 4 show two different p-n junction diode structures in cross section, for explanation of two typical examples of the p-n junction preparing method according to this invention.

The schematic cross section of a p-n junction diode structure shown in FIG. 3 is to illustrate the theoretical aspect of the method of making p-n junctions according to this invention. If a metal containing a p-type (or an n-type) impurity is attached to the surface of an outdiffused n-type (or p-type) semiconductor wafer 31 and the impurity contained in the metal is doped into the wafer 31 to form a p-type (or n-type) region 32 in such a manner that the region 32 may penetrate deep enough, it will be obvious that the maximum reverse voltage $V_{BS}$ for the shallow part of the p-n junction becomes relatively larger than $V_{BI}$ for the inner or deepest part of the p-n junction, because the former breakdown voltage becomes higher than the breakdown voltage which would be obtained if no outdiffusion were performed, whereas the latter should remain unchanged in spite of outdiffusion. Operation of such a p-n junction diode will be less susceptible to the surface breakdown, since the lowering of the breakdown voltage may well be recovered by an increase in surface breakdown voltage $V_{BS}$. This phenomenon may be considered as being analogous to that exhibited by the guard ring structure as illustrated in FIG. 1. Incidentally, the dots scattering in the cross section of the semiconductor wafer 31 in FIG. 3 represents symbollically the n-type (or p-type) impurity concentration distribution in the wafer, the concentration being homogeneous at or below the bottom plane of the junction and decreasing gradually towards the wafer surface above that bottom plane.

Figure 4:
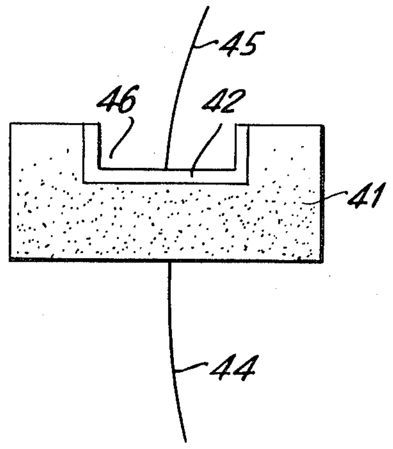

The similar outdiffusion effect as mentioned above may also be displayed with a p-n junction diode structure as illustrated in FIG. 4. This diode structure may be fabricated, as will be evident to one skilled in the art, as follows: A recessed portion 46 is provided by chemical etching in an outdiffused semiconductor wafer 41 in such a manner that the bottom of the recess may reach a suitable depth. Then a shallow or thin layer 42 containing impurities opposite in conductivity type to those in the substrate wafer is formed in or on the substrate surface by use of a known diffusion or epitaxial growth process. In either case, the bottom part of the p-n junction thus made should meet the aforementioned requirements. Referring to FIGS. 3 and 4, each of 34, 35 44, and 45 denotes a lead wire.

To facilitate an understanding of this invention, an embodiment of the method according to this invention will be outlined.

A p-type silicon wafer containing $5\times10^{16}$ In/cm.$^3$ is subjected to an outdiffusion run of 15 hours at 1250° C. under an oxygen atmosphere to form a thermally grown silicon dioxide layer, approximately 3.4$\mu$ in thickness, at the wafer surface. During this thermal oxidation process, indium contained as an impurity in the silicon wafer depletes strongly from silicon as a result of the segregation at the oxide-silicon interface so that the impurity concentration at the substrate top becomes $5\times10^{15}$ In/cm.$^3$, while that at a depth approximately 4$\mu$ therefrom becomes substantially the same as in the starting silicon wafer.

A part of the $SiO_2$ layer is removed by fluoric acid through a selective etching process and then, to a suitable area of this outdiffused and partly stripped wafer, silver (Ag) containing 1 weight percent of phosphorus (P) is vacuum-evaporated to form a layer, 2$\mu$ in thickness. The processed wafer is heated for 1 minute at 900° C. in a vacuum to insure sufficient diffusion of phosphorus into the wafer. A p-n junction diode is accomplished then by applying additional processes such as pelletarization, lead bonding, encasing, etc. to this wafer.

The bottom part of this p-n junction thus prepared is disposed at a depth of approximately 5$\mu$ from the wafer surface. The theoretically predicted breakdown voltage for the impurity concentration in silicon at this depth is approximately 25 volts, whereas that at the wafer surface is as high as 90 volts. Granting that the actual value of the surface breakdown voltage may be lowered more or less from the theoretical value of 90 volts on account of surface irregularities, surface boundary conditions, etc., it will yet remain appreciably larger than the inward breakdown voltage or 25 volts.

To conclude, the p-n junction preparing method according to this invention can claim, it is believed, to hold a great deal of practical utility in that the p-n junctions can be integrated into diode structures simply and reliably, that yields can be improved, and that the widening of the breakdown voltage range of such diodes can be expected.

Although the invention has been described with particular reference to specific embodiments, it is to be clearly understood that the present method may be modified without departing from the essential scope of this invention as defined in the appended claims.

I claim:

1. A method of preparing p-n junctions in semiconductor wafers containing an impurity which comprises, subjecting a semiconductor wafer to thermal treatment whereby to cause said impurity to diffuse outward so that the concentration of the impurity at least adjacent the surface of the wafer is lower than the bulk concentration and then forming a p-n junction in the wafer such that the bottom part of said p-n junction may reach a region of said semiconductor wafer where the outdiffusion in regard to the impurity concentration is no more effected.

2. The method of claim 1, wherein the semiconductor is a p-type silicon wafer and wherein the impurity is indium.

3. The method of claim 2, wherein the means by which the indium is caused to diffuse outward includes heating said wafer to an elevated temperature in an oxygen atmosphere to form a silicon dioxide layer on the substrate whereby to decrease the indium concentration at the interface.

4. The method of claim 3, wherein a part of the silicon dioxide layer is removed by etching and an impurity opposite in conductivity to the impurity in the substrate is deposited and diffused into the etched substrate.

5. A method of preparing p-n junctions in a semiconductor element comprising the steps of forming a silicon dioxide layer on the surface of a semiconductor wafer uniformly containing impurities of one conductivity type, outdiffusing said impurities from said surface so as to make the impurity concentration in the vicinity of said surface lower than the bulk concentration of said wafer; selectively etching a part of said silicon dioxide layer to expose a preselected area of said surface; depositing impurities of opposite conductivity type onto said preselected area and diffusing said opposite-type impurities into said wafer, thereby forming a p-n junction, the edge portion of said junction attaining to said surface and the bottom portion of said junction attaining to a region of said wafer unaffected by said outdiffusion.

References Cited

UNITED STATES PATENTS 3,134,159 5/1964 Lehovec et al. ------ 148—191

L. DEWAYNE RUTLEDGE, Primary Examiner

W. W. STALLARD, Assistant Examiner